United States Patent
Nakamoto

(10) Patent No.: US 7,400,044 B2
(45) Date of Patent: Jul. 15, 2008

(54) SEMICONDUCTOR INTEGRATED CIRCUIT DEVICE

(75) Inventor: Norihito Nakamoto, Kanagawa (JP)

(73) Assignee: NEC Electronics Corporation, Kawasaki, Kanagawa (JP)

(\*) Notice: Subject to any disclaimer, the term of this patent is extended or adjusted under 35 U.S.C. 154(b) by 128 days.

(21) Appl. No.: 11/451,407

(22) Filed: Jun. 13, 2006

(65) Prior Publication Data

US 2006/0292806 A1    Dec. 28, 2006

(30) Foreign Application Priority Data

Jun. 22, 2005    (JP)    ............... 2005-181850

(51) Int. Cl.
*H01L 23/48*    (2006.01)
(52) U.S. Cl. ............... 257/758; 257/E23.143
(58) Field of Classification Search ............... 257/758, 257/211, 23.143, E23.153
See application file for complete search history.

(56) References Cited

U.S. PATENT DOCUMENTS

2006/0292806 A1\* 12/2006 Nakamoto ............... 438/299

FOREIGN PATENT DOCUMENTS

JP    61-196617    8/1986

\* cited by examiner

*Primary Examiner*—Mark Prenty
(74) *Attorney, Agent, or Firm*—McGinn IP Law Group, PLLC

(57) ABSTRACT

To improve a degree of integration and reliability of a semiconductor integrated circuit device. There are included third wire 14 arranged in the same layer as first wire 11 and second wire 12 and arranged in a direction intersecting with the first wire 11 and the second wire 12, first gate material wire 18 arranged between the first wire 11 and first well 5 in the vicinity of an intersecting point between wiring directions of the first wire 11 and the third wire 14 and electrically connected to the third wire 14 through via holes, and first diffusion layer 6 arranged in second well 4 in the vicinity of an intersecting point between wiring directions of the second wire 12 and the third wire 14. The first diffusion layer 6 is electrically connected to the third wire 14 through via holes and each includes impurities having a concentration higher than each of the second wells 4. The first gate material wire 18 and the first diffusion layer 6 are used as a wire path for substrate back-bias control associated with the third wire 14.

15 Claims, 2 Drawing Sheets

X–X'

Y–Y'

SEMICONDUCTOR INTEGRATED CIRCUIT DEVICE

FIELD OF THE INVENTION

The present invention relates to a semiconductor integrated circuit device having wires for controlling a substrate back bias. More specifically, the invention relates to the semiconductor integrated circuit device in which reliability and an integration degree of the device is improved.

BACKGROUND OF THE INVENTION

In recent years, it has become important to reduce power consumption of semiconductor integrated circuit devices. Importance is attached to reduction of a supply voltage so as to reduce the power consumption. Then, in order to increase processing capability even if the supply voltage is reduced, the substrate back bias for the semiconductor integrated circuit device is controlled. The substrate back bias is a weak back bias voltage to be applied to a well formed in a substrate for a transistor. When the transistor is operated, the substrate back bias is applied in a forward direction to facilitate flow of a current through a channel of the transistor. The transistor is thereby operated at a low voltage, and the faster operation is achieved. On the other hand, when the transistor is stopped, the substrate back bias in the forward direction is not applied, thereby reducing current leakage.

The substrate back bias is supplied through wires for substrate back-bias control, disposed aside from wires for ordinary substrate bias control. A description will be given to conventional wires in a semiconductor integrated circuit for supplying the bias, by using drawings. FIG. 2A is a partial plan view and FIG. 2B is a partially enlarged sectional view taken along a line Y-Y', both schematically showing a wiring structure for supplying the bias to a semiconductor integrated circuit device according to a prior art.

In a semiconductor integrated circuit device 101, on a deep N well 103 in a P-type substrate 102, P wells 104 and N wells 105 are formed in the form of strips, respectively. In an interlayer insulating film 108 on the P wells 104, substrate bias controlling GND wires 112 are formed in a direction in which the P wells 104 extend. In the interlayer insulating film 108 on the N wells 105, substrate bias controlling VDD wires 111 are formed in a direction in which the N wells 105 extend. On the interlayer insulating film 108 above the substrate bias controlling VDD wires 111 and the substrate bias controlling GND wires 112, a substrate back-bias controlling VDD wire 113 and a substrate back-bias controlling GND wire 114 that three-dimensionally intersect with the substrate bias controlling VDD wires 111 and the substrate bias controlling GND wires 112 are formed. In each N well 105 in the vicinity of a point at which a substrate bias controlling VDD wire 111 three-dimensionally intersects with the substrate back-bias controlling VDD wire 113, an N+ diffusion layer 107 is formed. In each P well 104 in the vicinity of a point at which a substrate bias controlling GND wire 112 three-dimensionally intersects with the substrate back-bias controlling GND wire 114, a P+ diffusion layer 106 is formed. The substrate back-bias controlling VDD wire 113 is electrically connected to N+ diffusion layers 107 through via contacts 115, while the substrate back-bias controlling GND wire 114 is electrically connected to P+ diffusion layers 106 through via contacts 116. Signal lines 117 electrically connected to transistors (not shown) are formed in the interlayer insulating film 108 between the substrate back-bias controlling VDD wire 113 and the substrate back-bias controlling GND wire 114, above the substrate bias controlling VDD wires 111 and the substrate bias controlling GND wires 112. Since a potential difference between the substrate back-bias controlling wires 113 and 114 and the signal lines 117 is large, a predetermined interval is secured between the substrate back-bias controlling wires 113 and 114 and the signal lines 117.

[Patent Document 1]
Japanese Patent Kokai Publication No. JP-A-61-196617

SUMMARY OF THE DISCLOSURE

When the substrate back-bias controlling VDD wire 113 and the substrate back-bias controlling GND wire 114 are formed above the substrate bias controlling VDD wires 111 and the substrate bias controlling GND wires 112, however, it is necessary to increase a diameter of each of the via contacts 115 and 116. Thus, the number of the signal lines 117 that can be formed between the substrate back-bias controlling VDD wire 113 and the substrate back-bias controlling GND wire 114 is reduced, so that the degree of integration of the semiconductor integrated circuit device 101 may be reduced. On the other hand, when the degree of integration of the semiconductor integrated circuit device 101 is to be increased, TDDB (time dependent dielectric breakdown) between the substrate back-bias controlling wire 113 or 114 and the signal lines 117 may tend to occur. In the semiconductor integrated circuit device in recent years in particular, in which Cu is often employed for the substrate back-bias controlling wires 113 and 114 and the signal lines 117 for micromachining or a Low-K film is often employed for the interlayer insulating film 108, a problem associated with reliability such as the TDDB has become manifest.

Accordingly there is much to be desired in the art.

It is an object of the present invention to improve the degree of integration and reliability of a semiconductor integrated circuit device. Further objects of the semiconductor integrated circuit device will become apparent from the entire disclosure including appended claims.

According to an aspect of the present invention there is provided a semiconductor integrated circuit device having wires for substrate back-bias control according to an aspect of the present invention. The semiconductor integrated circuit device comprises:

a first wire arranged along a first well in a substrate;

a second wire arranged along a second well in the substrate;

a third wire arranged in the same layer as the first wire and the second wire, the third wire being arranged in a direction intersecting with the first wire and the second wire and electrically insulated from the first wire and the second wire;

a first gate material wire arranged between the first wire and the first well in the vicinity of an intersecting point between wiring directions of the first wire and the third wire, the first gate material wire being electrically connected to the third wire through via holes, the first gate material wire being formed of a same material as a gate material; and a first diffusion layer arranged in the second well in the vicinity of an intersecting point between wiring directions of the second wire and the third wire, the first diffusion layer being electrically connected to the third wire through via holes, the first diffusion layer including impurities having a higher concentration than that of the second well;

the first gate material wire and the first diffusion layer being employed as a wiring path (for the substrate back-bias control) associated with the third wire.

In a second aspect of the present invention, it is preferred that the semiconductor integrated circuit device of the present invention includes:

a fourth wire arranged in the same layer as the first wire and the second wire, the fourth wire being arranged in a direction intersecting with the first wire and the second wire, the fourth wire being electrically insulated from the first wire and the second wire and arranged separated from the third wire at a predetermined interval;

a second diffusion layer arranged in the first well in the vicinity of an intersecting point between wiring directions of the first wire and the fourth wire, the second diffusion layer being electrically connected to the fourth wire through via holes, the second diffusion layer including impurities having a higher concentration than that of the first well; and a second gate material wire arranged between the second wire and the second well in the vicinity of an intersecting point between wiring directions of the second wire and the fourth wire, the second gate material wire being electrically connected to the fourth wire through via holes, the second gate material wire being formed of the same material as the gate material;

the second gate material wire and the second diffusion layer being used in a wire path (for the substrate back-bias control) associated with the fourth wire.

In a third aspect of the present invention, it is preferable that a third well is formed in the substrate under the first well and the second well, the conductivity type of the third well being the same as the conductivity type of the first well.

In a fourth aspect of the present invention, it is preferable that the third wire is formed in a wiring layer closest to the substrate, among wiring layers formed above the substrate.

In a fifth aspect of the present invention, it is preferable that the third wire is formed at the same time as the step of forming the first wire and the second wire.

In a sixth aspect of the present invention, it is preferable that the first diffusion layer is formed at the same time as the step of forming source/drain regions of transistors formed in region of the first well.

In a seventh aspect of the present invention, it is preferable that the first gate material wire is formed at the same time as the step of forming gate electrodes of the transistors.

The meritorious effects of the present invention are summarized as follows.

According to the present invention (as set forth in aspects 1 to 7), the diffusion layer and the gate material wire are used for the wire path for the substrate back-bias control. Thus, a wire width of the third wire can be reduced. Pressure upon the signal line formed in a layer upper than that for the third wire is thus eliminated. The degree of integration and reliability of the device can be thereby improved.

According to the present invention (as set forth in aspects 5 to 7), the third wire (and the fourth wire), first diffusion layer (first diffusion layer), and first gate material wire (and the second gate material wire) can be formed without adding a new step to a step of forming ordinary transistor(s) and wire (s). Thus, an increase in a manufacturing cost of the device will not be brought about. Further, the third wire for the substrate back-bias control can be formed in the same step as that for the first wire and the second wire. The manufacturing cost of the device can also be reduced.

PREFERRED EMBODIMENTS OF THE INVENTION (First Embodiment)

Figure 1A:
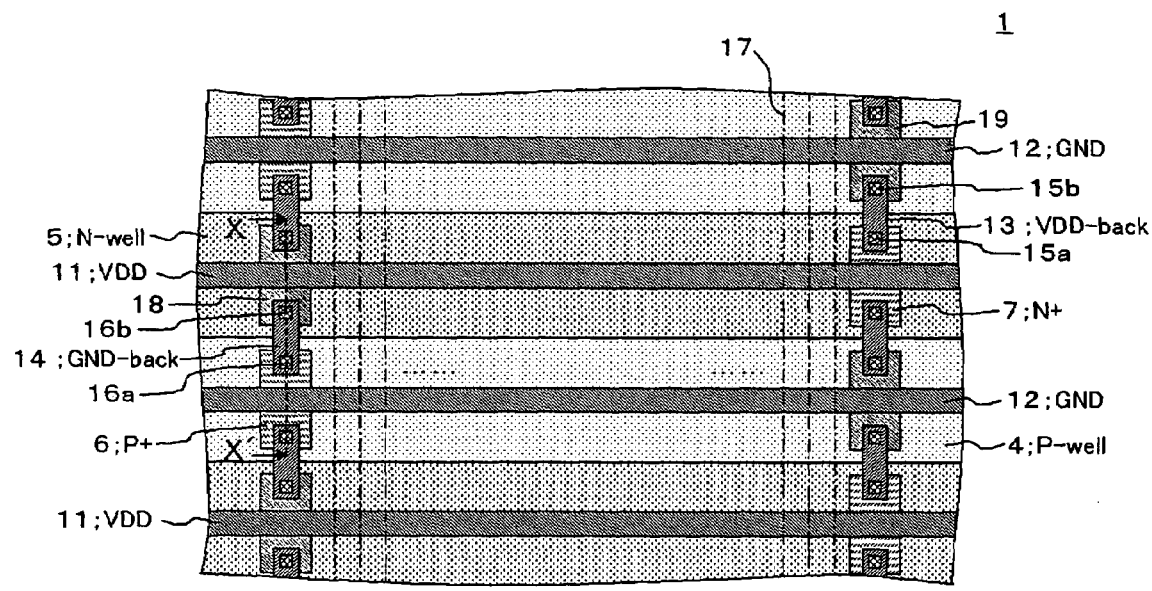
FIG. 1A is a partial plan view and FIG. 1B is a partially enlarged sectional view taken along a line X-X', both schematically showing a wiring structure for supplying a bias to a semiconductor integrated circuit device according to a first embodiment of the present invention.
Figure 1B:
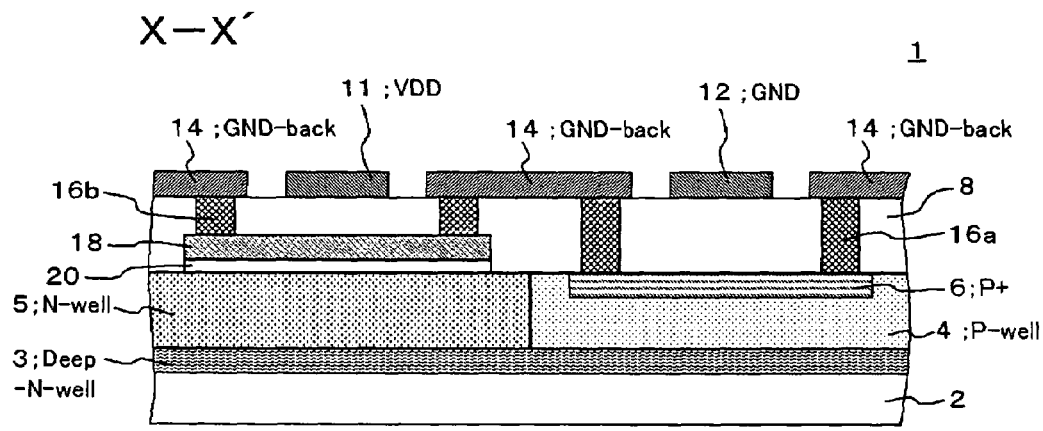
Figure 2A:
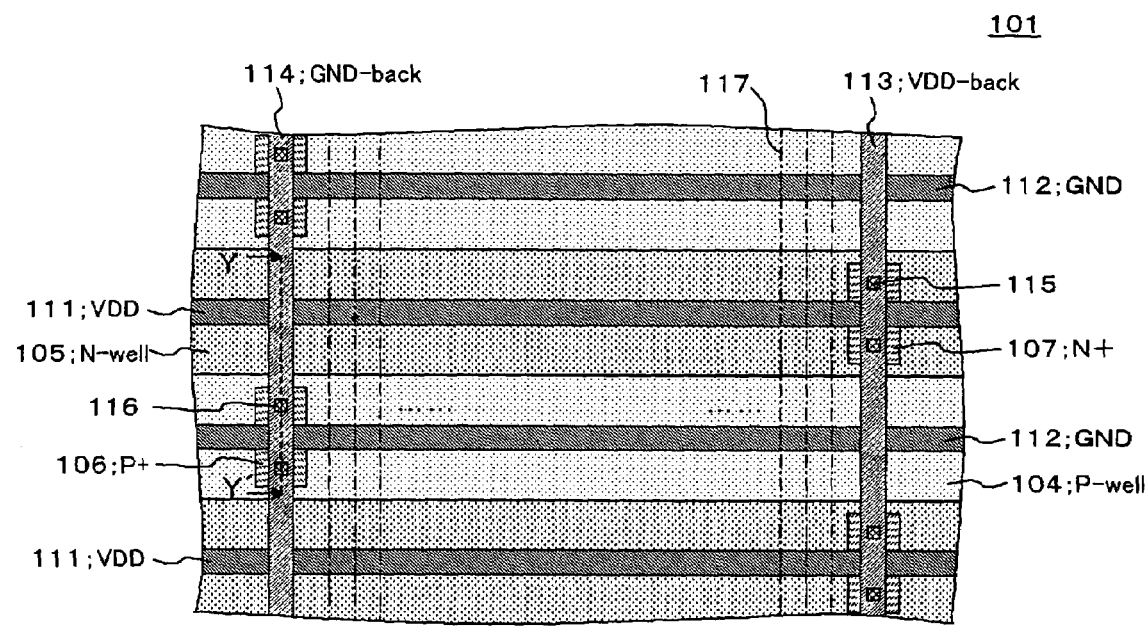
FIG. 2A is a partial plan view and FIG. 2B is a partially enlarged sectional view taken along a line Y-Y', both schematically showing a wiring structure for supplying a bias to a semiconductor integrated circuit device according to a prior art.
Figure 2B:
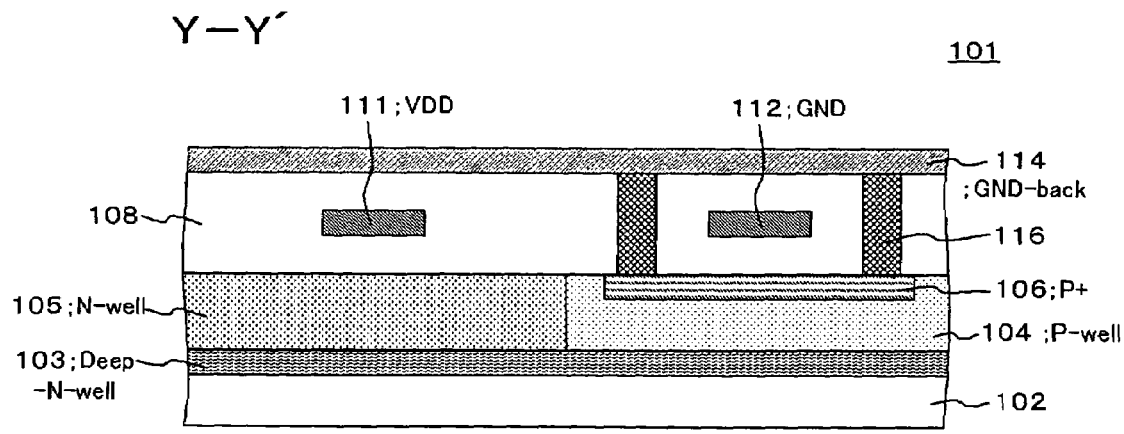

A semiconductor integrated circuit device according to a first embodiment of the present invention will be described using drawings. FIG. 1 includes FIG. 1A and FIG. 1B, which schematically show a wiring structure for supplying a bias to the semiconductor integrated circuit device according to the first embodiment of the present invention. FIG. 1A is a partial plan view, and FIG. 1B is a partially enlarged sectional view, taken along a line X-X'.

A semiconductor integrated circuit device 1 includes a substrate 2, a deep N well(s) 3, P well(s) 4, N well(s) 5, P+ diffusion layer(s) 6, N+ diffusion layer(s) 7, an interlayer insulating film 8, substrate bias controlling VDD wire(s) 11, substrate bias controlling GND wire(s) 12, substrate back-bias controlling VDD wire(s) 13, substrate back-bias controlling GND wire(s) 14, via contacts 15a, 15b, 16a and 16b, signal lines 17, gate material wires 18 and 19.

The substrate 2 is a P-type silicon substrate. The deep N well 3 is an N-type well formed in a deep region in the substrate 2. The P well(s) 4 is/are P-type well(s) formed on the deep N-well 3 in the substrate 2 in the shape of strips. The N well(s) 5 is/are N-type well(s) formed on the deep N-well 3 in the substrate 2 in the shape of strips. Incidentally, the substrate 2 in FIG. 1 is a triple-well structure. The substrate 2 is not limited to this. The substrate 2 may be a twin-well structure, or an SOI (Silicon on Insulator) substrate having the twin-well structure with a silicon single-crystal film formed on an insulating film may be used as the substrate 2.

A P+ diffusion layer 6 is the diffusion layer including P-type impurities having a higher concentration than P-type impurities of a P well 4, and is formed in the P well 4 in the vicinity of a point at which a substrate bias controlling GND wire 12 three-dimensionally intersects with a substrate back-bias controlling GND wire 14. The P+ diffusion layer 6 is also used as a bypass wire for the substrate back-bias controlling GND wire 14, and also serves to avoid collision between the substrate back-bias controlling GND wire 14 and the substrate bias controlling GND wire 12. The P+ diffusion layer 6 can be formed at the same time as a step of forming source/drain regions (not shown) of transistor(s) formed in the region of the N wel(s) 5.

An N+ diffusion layer 7 is the diffusion layer including N-type impurities having a higher concentration than N-type impurities in an N well 5, and the N+ diffusion layer 7 is formed in the N well 5 in the vicinity of a point at which a substrate bias controlling VDD wire 11 three-dimensionally intersects with a substrate back-bias controlling VDD wire 13. The N+ diffusion layer 7 is used as a bypass wire for the substrate back-bias controlling VDD wire 13 and also serves to avoid collision between the substrate back-bias controlling VDD wire 13 and the substrate bias controlling VDD wire 11. The N+ diffusion layer 7 can be formed at the same time as a step of forming source/drain regions (not shown) of transistors formed in the region of the P well(s) 4.

The interlayer insulating film 8 is the insulating film used for a multi-layer wiring layer above the substrate 2. An insulating material such as silicon oxide, a low K material, or the like can be used for the interlayer insulating film 8.

The substrate bias controlling VDD wire 11 is the VDD wire used for substrate bias control, and is formed on the interlayer insulating film 8 on the N well 5 along a direction in which the N well 5 extends. The substrate bias controlling GND wire 12 is the GND wire used for the substrate bias control and is formed on the interlayer insulating film 8 on the P well 4 along a direction in which the P well 4 extends. A wire material such as Cu or Al is used for the substrate bias controlling VDD wire 11 and the substrate bias controlling GND wire 12.

The substrate back-bias controlling VDD wire 13 is the VDD wire used for substrate back-bias control, and is formed in the same layer as that for the substrate bias controlling VDD wires 11 and the substrate bias controlling GND wires 12 on the interlayer insulating film 8. The substrate back-bias controlling VDD wire 13 is arranged between the substrate bias controlling VDD wire 11 and the substrate bias controlling GND wire 12 in the form of an island in a direction orthogonal to the substrate bias controlling VDD wire 11 and the substrate bias controlling GND wire 12, and is electrically insulated from the substrate bias controlling VDD wire 11 and the substrate bias controlling GND wire 12.

The substrate back-bias controlling GND wire 14 is the GND wire used for the substrate back-bias control, and is formed in the same layer as that for the substrate bias controlling VDD wires 11 and the substrate bias controlling GND wires 12 on the interlayer insulating film 8. The substrate back-bias controlling GND wire 14 is arranged between the substrate bias controlling VDD wire 11 and the substrate bias controlling GND wire 12 in the form of an island in a direction orthogonal to the substrate bias controlling VDD wire 11 and the substrate bias controlling GND wire 12, and is electrically insulated from the substrate bias controlling VDD wire 11 and the substrate bias controlling GND wire 12.

The same material as that for the substrate bias controlling VDD wires 11 and the substrate bias controlling GND wires 12 can be used for the substrate back-bias controlling VDD wires 13 and the substrate back-bias controlling GND wires 14. The substrate back-bias controlling VDD wires 13 and the substrate back-bias controlling GND wires 14 can be formed at the same time as a step of forming the substrate bias controlling VDD wires 11 and the substrate bias controlling GND wires 12. Preferably, the substrate back-bias controlling VDD wires 13 and the substrate back-bias controlling GND wires 14 are formed in a lowermost wiring layer of the multi-layer wiring layer, closest to the substrate 2. The reason for this is as follows. With this arrangement, diameters of the via contacts 15a, 15b, 16a, and 16b can be reduced, so that wire width can be reduced. The number of the signal lines 17 that can be arranged between the substrate back-bias controlling VDD wires 13 and the substrate back-bias controlling GND wires 14 as seen from a direction normal to a plane can be increased. An integration degree of the device can be thereby improved.

The via contact 15a is a via contact that electrically connects the substrate back-bias controlling VDD wire 13 and a corresponding one of the N+ diffusion layers 7, and is formed in the interlayer insulating film 8. The via contact 15b is a via contact that electrically connects the substrate back-bias controlling VDD wire 13 and a corresponding one of the gate material wires 18, and is formed in the interlayer insulating film 8.

The via contact 16a is the via contact that electrically connects the substrate back-bias controlling GND wire 14 and a corresponding one of the P+ diffusion layers 6, and is formed in the interlayer insulating film 8. The via contact 16b is the via contact that electrically connects the substrate back-bias controlling VDD wire 13 and a corresponding one of the gate material wires 19, and is formed in the interlayer insulating film 8.

The signal lines 17 are wires for signals for establishing electrical connections with transistors (not shown) and are formed in a layer upper than those for the wires 11, 12, 13, and 14 and are formed between the substrate back-bias controlling VDD wires 13 and the substrate back-bias controlling GND wires 14, as seen from the direction normal to the plane.

A gate material wire 18 is the wire used as a bypass for the substrate back-bias controlling VDD wire 14, and is formed of the same material as a gate material (such as polysilicon, silicide, metal, or the like) used for a gate electrode (not shown), and is formed on an insulating film 20 in the same layer as that for a gate insulating film (not shown) in the interlayer insulating film 8. The gate material wire 18 serves to avoid collision between the substrate back-bias controlling VDD wire 14 and the substrate bias controlling GND wire 11. The gate material wire 18 can be formed at the same time as a step of forming gate electrodes (not shown) of the transistors.

A gate material wire 19 is the wire used as a bypass for the substrate back-bias controlling VDD wire 13, and is formed of the same material as the gate material (such as polysilicon, silicide, metal, or the like) used for the gate electrode (not shown), and is formed on an insulating film (not shown) in the same layer as that for the gate insulating film (not shown) in the interlayer insulating film 8. The gate material wire 19 serves to avoid collision between the substrate back-bias controlling VDD wire 13 and the substrate bias controlling GND wire 12. The gate material wire 19 can be formed at the same time as a step of forming the gate electrodes (not shown) of the transistors.

Next, a path for supplying a potential for the substrate back-bias control in the semiconductor integrated circuit device according to the first embodiment will be described. A GND potential for the substrate back-bias control is supplied to the P wells 4 through the P+ diffusion layers 6 by repetition of a path starting from the substrate back-bias controlling GND wire 14, via contact 16a, P+ diffusion layer 6, via contact 16a, substrate back-bias controlling GND wire 14, via contact 16b, gate material wire 18, via contract 16b, reaching to substrate back-bias controlling GND wire 14. A VDD potential for the substrate back-bias control is supplied to the N wells 5 through the N+ diffusion layers 7 by repetition of a path starting from the substrate back-bias controlling VDD wire 13, via contact 15a, N+ diffusion layer 7, via contact 15a, substrate back-bias controlling VDD wire 13, via contact 15b, gate material wire 19, via contact 15b, reaching to substrate back-bias controlling VDD wire 13. Since the substrate back bias is a weak back bias voltage to be applied to respective wells formed in the substrate for the transistors, no problem occurs even if the P+ diffusion layers 6, N+ diffusion layers 7, gate material wires 18, and gate material wires 19 are used as part of wiring for the substrate back-bias control.

(Effects)

According to the first embodiment, in addition to the substrate back-bias controlling VDD wires 13 and the substrate back-bias controlling GND wires 14, the P+ diffusion layers 6, N+ diffusion layers 7, gate material wires 18, and gate material wires 19 can be used in the path for supplying the potential for the substrate back-bias control. Collision between the substrate back-bias controlling VDD wire 13 and the substrate bias controlling VDD wire 11 or the substrate bias controlling GND wire 12 and collision between the substrate back-bias controlling GND wire 14 and the substrate bias controlling GND wire 12 or the substrate bias controlling VDD wire 11 can be thereby avoided, and wire widths of the substrate back-bias controlling VDD wire 13 and substrate back-bias controlling GND wire 14 can be reduced. Thus, a constraint, i.e., adverse effect on the signal lines 17 will be reduced.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
   a first wire arranged along a first well in a substrate;
   a second wire arranged along a second well in the substrate;
   a third wire arranged in a same layer as the first wire and the second wire, the third wire being arranged in a direction intersecting with the first wire and the second wire and electrically insulated from the first wire and the second wire;
   a first gate material wire arranged between the first wire and the first well in the vicinity of an intersecting point between wiring directions of the first wire and the third wire, the first gate material wire being electrically connected to the third wire through via holes, the first gate material wire being formed of a same material as a gate material; and
   a first diffusion layer arranged in the second well in the vicinity of an intersecting point between wiring directions of the second wire and the third wire, the first diffusion layer being electrically connected to the third wire through via holes, the first diffusion layer including impurities having a higher concentration than that of the second well;
   the first gate material wire and the first diffusion layer being employed as a wiring path associated with the third wire.

2. The semiconductor integrated circuit device according to claim 1, comprising:
   a fourth wire arranged in a same layer as the first wire and the second wire, the fourth wire being arranged in a direction intersecting with the first wire and the second wire, the fourth wire being electrically insulated from the first wire and the second wire and arranged separated from the third wire at a predetermined interval;
   a second diffusion layer arranged in the first well in the vicinity of an intersecting point between wiring directions of the first wire and the fourth wire, the second diffusion layer being electrically connected to the fourth wire through via holes, the second diffusion layer including impurities having a higher concentration than that of the first well; and a second gate material wire arranged between the second wire and the second well in the vicinity of an intersecting point between wiring directions of the second wire and the fourth wire, the second gate material wire being electrically connected to the fourth wire through via holes, the second gate material wire being formed of a same material as the gate material;
   the second gate material wire and the second diffusion layer being used in a wire path associated with the fourth wire.

3. The semiconductor integrated circuit device according to claim 1, wherein a third well is formed in said substrate under said first well and said second well, a conductivity type of said third well being the same as a conductivity type of said first well.

4. The semiconductor integrated circuit device according to claim 1, wherein said third wire is formed in a wiring layer closest to said substrate, among wiring layers formed above said substrate.

5. The semiconductor integrated circuit device according to claim 1 wherein said third wire is formed at a same time forming said first wire and said second wire.

6. The semiconductor integrated circuit device according to claim 1, wherein said first diffusion layer is formed at a same time as forming a source/drain region of a transistor formed in a region of said first well.

7. The semiconductor integrated circuit device according to claim 6, wherein said first gate material wire is formed at a same time as forming gate electrodes of said transistor.

8. The semiconductor integrated circuit device according to claim 2, wherein a third well is formed in said substrate under said first well and said second well, a conductivity type of said third well being the same as a conductivity type of said first well.

9. The semiconductor integrated circuit device according to claim 2, wherein said third wire is formed in a wiring layer closest to said substrate, among wiring layers formed above said substrate.

10. The semiconductor integrated circuit device according to claim 3, wherein said third wire is formed in a wiring layer closest to said substrate, among wiring layers formed above said substrate.

11. The semiconductor integrated circuit device according to claim 2, wherein said third wire is formed at a same time as forming said first wire and said second wire.

12. The semiconductor integrated circuit device according to claim 3, wherein said third wire is formed at a same time as forming said first wire and said second wire.

13. The semiconductor integrated circuit device according to claim 4, wherein said third wire is formed at a same time as forming said first wire and said second wire.

14. The semiconductor integrated circuit device according to claim 2, wherein said first diffusion layer is formed at a same time as forming a source/drain region of a transistor formed in a region of said first well.

15. The semiconductor integrated circuit device according to claim 14, wherein said first gate material wire is formed at a same time as forming gate electrodes of said transistor.

* * * * *